United States Patent
Mishra et al.

(10) Patent No.: US 9,184,275 B2
(45) Date of Patent: Nov. 10, 2015

(54) SEMICONDUCTOR DEVICES WITH INTEGRATED HOLE COLLECTORS

(75) Inventors: Umesh Mishra, Montecito, CA (US); Srabanti Chowdhury, Goleta, CA (US); Ilan Ben-Yaacov, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 215 days.

(21) Appl. No.: 13/535,094

(22) Filed: Jun. 27, 2012

(65) Prior Publication Data

US 2014/0001557 A1 Jan. 2, 2014

(51) Int. Cl.
*H01L 31/0328* (2006.01)
*H01L 29/778* (2006.01)
*H01L 29/06* (2006.01)
*H01L 29/40* (2006.01)
*H01L 29/423* (2006.01)
*H01L 29/20* (2006.01)
*H01L 29/207* (2006.01)

(52) U.S. Cl.
CPC ........ *H01L 29/7786* (2013.01); *H01L 29/0619* (2013.01); *H01L 29/2003* (2013.01); *H01L 29/207* (2013.01); *H01L 29/402* (2013.01); *H01L 29/4236* (2013.01); *H01L 29/42316* (2013.01); *H01L 29/42376* (2013.01)

(58) Field of Classification Search
CPC .............. H01L 29/2003; H01L 29/402; H01L 29/7786
USPC .......... 257/183, 192, 194, E29.246, E29.249; 438/191, 285
See application file for complete search history.

(56) References Cited

U.S. PATENT DOCUMENTS

| | | |
|---|---|---|
| 4,300,091 A | 11/1981 | Schade, Jr. |
| 4,645,562 A | 2/1987 | Liao et al. |
| 4,728,826 A | 3/1988 | Einzinger et al. |
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |

(Continued)

FOREIGN PATENT DOCUMENTS

| | | |
|---|---|---|
| CN | 1748320 | 3/2006 |
| CN | 101107713 | 1/2008 |

(Continued)

OTHER PUBLICATIONS

Authorized officer Sang Won Choi, International Search Report and Written Opinion in PCT/US2013/048275, mailed Oct. 14, 2013, 17 pages.

(Continued)

*Primary Examiner* — Matthew E Warren
(74) *Attorney, Agent, or Firm* — Fish & Richardson P.C.

(57) ABSTRACT

Transistor devices which include semiconductor layers with integrated hole collector regions are described. The hole collector regions are configured to collect holes generated in the transistor device during operation and transport them away from the active regions of the device. The hole collector regions can be electrically connected or coupled to the source, the drain, or a field plate of the device. The hole collector regions can be doped, for example p-type or nominally p-type, and can be capable of conducting holes but not electrons.

24 Claims, 11 Drawing Sheets

(56) References Cited

U.S. PATENT DOCUMENTS

| | | |
|---|---|---|
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,307,220 B1 * | 10/2001 | Yamazaki ............... 257/192 |
| 6,316,793 B1 | 11/2001 | Sheppard et al. |
| 6,373,082 B1 | 4/2002 | Ohno et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,583,454 B2 | 6/2003 | Sheppard et al. |
| 6,586,781 B2 | 7/2003 | Wu et al. |
| 6,649,497 B2 | 11/2003 | Ring |
| 6,727,531 B1 | 4/2004 | Redwing et al. |
| 6,777,278 B2 | 8/2004 | Smith |
| 6,849,882 B2 | 2/2005 | Chavarkar et al. |
| 6,867,078 B1 | 3/2005 | Green et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,045,404 B2 | 5/2006 | Sheppard et al. |
| 7,071,498 B2 | 7/2006 | Johnson et al. |
| 7,084,475 B2 | 8/2006 | Shelton et al. |
| 7,125,786 B2 | 10/2006 | Ring et al. |
| 7,126,212 B2 | 10/2006 | Enquist et al. |
| 7,161,194 B2 | 1/2007 | Parikh et al. |
| 7,170,111 B2 | 1/2007 | Saxler |
| 7,230,284 B2 | 6/2007 | Parikh et al. |
| 7,238,560 B2 | 7/2007 | Sheppard et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,388,236 B2 | 6/2008 | Wu et al. |
| 7,419,892 B2 | 9/2008 | Sheppard et al. |
| 7,432,142 B2 | 10/2008 | Saxler et al. |
| 7,449,730 B2 | 11/2008 | Kuraguchi |
| 7,456,443 B2 | 11/2008 | Saxler et al. |
| 7,465,967 B2 | 12/2008 | Smith et al. |
| 7,501,669 B2 | 3/2009 | Parikh et al. |
| 7,544,963 B2 | 6/2009 | Saxler |
| 7,547,925 B2 | 6/2009 | Wong et al. |
| 7,548,112 B2 | 6/2009 | Sheppard |
| 7,550,783 B2 | 6/2009 | Wu et al. |
| 7,550,784 B2 | 6/2009 | Saxler et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,612,390 B2 | 11/2009 | Saxler et al. |
| 7,615,774 B2 | 11/2009 | Saxler |
| 7,638,818 B2 | 12/2009 | Wu et al. |
| 7,678,628 B2 | 3/2010 | Sheppard et al. |
| 7,692,263 B2 | 4/2010 | Wu et al. |
| 7,709,269 B2 | 5/2010 | Smith et al. |
| 7,709,859 B2 | 5/2010 | Smith et al. |
| 7,714,360 B2 | 5/2010 | Otsuka et al. |
| 7,745,851 B2 | 6/2010 | Harris |
| 7,755,108 B2 | 7/2010 | Kuraguchi |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,642 B2 | 9/2010 | Suh et al. |
| 7,812,369 B2 | 10/2010 | Chini et al. |
| 7,855,401 B2 | 12/2010 | Sheppard et al. |
| 7,875,537 B2 | 1/2011 | Suvorov et al. |
| 7,875,914 B2 | 1/2011 | Sheppard |
| 7,884,395 B2 | 2/2011 | Saito |
| 7,892,974 B2 | 2/2011 | Ring et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,955,918 B2 | 6/2011 | Wu et al. |
| 7,955,984 B2 | 6/2011 | Ohki |
| 7,960,756 B2 | 6/2011 | Sheppard et al. |
| 7,965,126 B2 | 6/2011 | Honea et al. |
| 7,985,986 B2 | 7/2011 | Heikman et al. |
| 8,049,252 B2 | 11/2011 | Smith et al. |
| 8,519,438 B2 | 8/2013 | Mishra et al. |
| 8,525,231 B2 * | 9/2013 | Park et al. ............... 257/194 |
| 2001/0032999 A1 | 10/2001 | Yoshida |
| 2001/0040247 A1 | 11/2001 | Ando et al. |
| 2002/0036287 A1 | 3/2002 | Yu et al. |
| 2002/0121648 A1 | 9/2002 | Hsu et al. |
| 2002/0163042 A1 | 11/2002 | Yamazaki et al. |
| 2002/0167023 A1 | 11/2002 | Chavarkar et al. |
| 2003/0003724 A1 | 1/2003 | Uchiyama et al. |
| 2003/0006437 A1 | 1/2003 | Mizuta et al. |
| 2003/0020092 A1 | 1/2003 | Parikh et al. |
| 2004/041169 A1 | 3/2004 | Ren et al. |
| 2004/0061129 A1 | 4/2004 | Saxler et al. |
| 2004/0164347 A1 | 8/2004 | Zhao et al. |
| 2005/0001235 A1 | 1/2005 | Murata et al. |
| 2005/0077541 A1 | 4/2005 | Shen et al. |
| 2005/0133816 A1 | 6/2005 | Fan et al. |
| 2005/0189561 A1 | 9/2005 | Kinzer et al. |
| 2005/0189562 A1 | 9/2005 | Kinzer et al. |
| 2005/0194612 A1 | 9/2005 | Beach |
| 2005/0253168 A1 | 11/2005 | Wu et al. |
| 2005/0274977 A1 | 12/2005 | Saito et al. |
| 2006/0011915 A1 | 1/2006 | Saito et al. |
| 2006/0043499 A1 | 3/2006 | De Cremoux et al. |
| 2006/0060871 A1 | 3/2006 | Beach |
| 2006/0076677 A1 | 4/2006 | Daubenspeck et al. |
| 2006/0102929 A1 | 5/2006 | Okamoto et al. |
| 2006/0108602 A1 | 5/2006 | Tanimoto |
| 2006/0108605 A1 | 5/2006 | Yanagihara et al. |
| 2006/0121682 A1 | 6/2006 | Saxler |
| 2006/0124962 A1 | 6/2006 | Ueda et al. |
| 2006/0157729 A1 | 7/2006 | Ueno et al. |
| 2006/0186422 A1 | 8/2006 | Gaska et al. |
| 2006/0189109 A1 | 8/2006 | Fitzgerald |
| 2006/0202272 A1 | 9/2006 | Wu et al. |
| 2006/0220063 A1 | 10/2006 | Kurachi et al. |
| 2006/0226442 A1 | 10/2006 | Zhang et al. |
| 2006/0255364 A1 | 11/2006 | Saxler et al. |
| 2006/0289901 A1 | 12/2006 | Sheppard et al. |
| 2007/0007547 A1 | 1/2007 | Beach |
| 2007/0018187 A1 | 1/2007 | Lee et al. |
| 2007/0018199 A1 | 1/2007 | Sheppard et al. |
| 2007/0018210 A1 | 1/2007 | Sheppard |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0131968 A1 | 6/2007 | Morita et al. |
| 2007/0132037 A1 | 6/2007 | Hoshi et al. |
| 2007/0134834 A1 | 6/2007 | Lee et al. |
| 2007/0145390 A1 | 6/2007 | Kuraguchi |
| 2007/0145417 A1 | 6/2007 | Brar et al. |
| 2007/0158692 A1 | 7/2007 | Nakayama et al. |
| 2007/0164315 A1 | 7/2007 | Smith et al. |
| 2007/0164322 A1 | 7/2007 | Smith et al. |
| 2007/0194354 A1 | 8/2007 | Wu et al. |
| 2007/0205433 A1 | 9/2007 | Parikh et al. |
| 2007/0210329 A1 | 9/2007 | Goto |
| 2007/0215899 A1 | 9/2007 | Herman |
| 2007/0224710 A1 | 9/2007 | Palacios et al. |
| 2007/0228477 A1 | 10/2007 | Suzuki et al. |

(56) References Cited

U.S. PATENT DOCUMENTS

| | | | |
|---|---|---|---|
| 2007/0241368 A1 | 10/2007 | Mil'shtein et al. | |
| 2007/0249119 A1* | 10/2007 | Saito | 438/253 |
| 2007/0278518 A1 | 12/2007 | Chen et al. | |
| 2007/0295985 A1 | 12/2007 | Weeks, Jr. et al. | |
| 2008/0073670 A1 | 3/2008 | Yang et al. | |
| 2008/0093626 A1 | 4/2008 | Kuraguchi | |
| 2008/0121876 A1 | 5/2008 | Otsuka et al. | |
| 2008/0121933 A1* | 5/2008 | Hayashi et al. | 257/192 |
| 2008/0157121 A1 | 7/2008 | Ohki | |
| 2008/0173944 A1 | 7/2008 | Coronel et al. | |
| 2008/0203430 A1 | 8/2008 | Simin et al. | |
| 2008/0230784 A1 | 9/2008 | Murphy | |
| 2008/0237606 A1 | 10/2008 | Kikkawa et al. | |
| 2008/0237640 A1 | 10/2008 | Mishra et al. | |
| 2008/0274574 A1 | 11/2008 | Yun | |
| 2008/0283844 A1 | 11/2008 | Hoshi et al. | |
| 2008/0296618 A1 | 12/2008 | Suh et al. | |
| 2008/0308813 A1 | 12/2008 | Suh et al. | |
| 2009/0001409 A1 | 1/2009 | Takano et al. | |
| 2009/0032820 A1 | 2/2009 | Chen | |
| 2009/0032879 A1 | 2/2009 | Kuraguchi | |
| 2009/0045438 A1 | 2/2009 | Inoue et al. | |
| 2009/0050936 A1 | 2/2009 | Oka | |
| 2009/0065810 A1 | 3/2009 | Honea et al. | |
| 2009/0072240 A1 | 3/2009 | Suh et al. | |
| 2009/0072269 A1* | 3/2009 | Suh et al. | 257/136 |
| 2009/0072272 A1 | 3/2009 | Suh et al. | |
| 2009/0075455 A1 | 3/2009 | Mishra | |
| 2009/0085065 A1 | 4/2009 | Mishra et al. | |
| 2009/0121775 A1 | 5/2009 | Ueda et al. | |
| 2009/0140262 A1 | 6/2009 | Ohki et al. | |
| 2009/0146185 A1 | 6/2009 | Suh et al. | |
| 2009/0152613 A1 | 6/2009 | Kim | |
| 2009/0201072 A1 | 8/2009 | Honea et al. | |
| 2009/0218598 A1 | 9/2009 | Goto | |
| 2009/0267078 A1 | 10/2009 | Mishra et al. | |
| 2010/0019225 A1 | 1/2010 | Lee | |
| 2010/0019279 A1 | 1/2010 | Chen et al. | |
| 2010/0065923 A1 | 3/2010 | Charles et al. | |
| 2010/0067275 A1 | 3/2010 | Wang et al. | |
| 2010/0133506 A1 | 6/2010 | Nakanishi et al. | |
| 2010/0140660 A1 | 6/2010 | Wu et al. | |
| 2010/0201439 A1 | 8/2010 | Wu et al. | |
| 2010/0203234 A1 | 8/2010 | Anderson et al. | |
| 2010/0219445 A1 | 9/2010 | Yokoyama et al. | |
| 2010/0244087 A1 | 9/2010 | Horie et al. | |
| 2010/0264461 A1 | 10/2010 | Rajan et al. | |
| 2010/0288998 A1 | 11/2010 | Kikuchi et al. | |
| 2011/0006346 A1 | 1/2011 | Ando et al. | |
| 2011/0012110 A1 | 1/2011 | Sazawa et al. | |
| 2011/0049526 A1 | 3/2011 | Chu et al. | |
| 2011/0249359 A1 | 10/2011 | Mochizuki et al. | |
| 2012/0168822 A1 | 7/2012 | Matsushita | |
| 2012/0193638 A1 | 8/2012 | Keller et al. | |
| 2012/0211760 A1* | 8/2012 | Yamada | 257/76 |
| 2012/0211800 A1 | 8/2012 | Boutros | |
| 2012/0217512 A1 | 8/2012 | Renaud | |
| 2012/0315445 A1 | 12/2012 | Mizuhara et al. | |
| 2013/0328061 A1* | 12/2013 | Chu et al. | 257/77 |
| 2014/0084346 A1* | 3/2014 | Tajiri | 257/194 |

FOREIGN PATENT DOCUMENTS

| | | |
|---|---|---|
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-215331 | 8/2007 |
| JP | 2008-199771 | 8/2008 |
| JP | 2010-087076 | 4/2010 |
| JP | 2010-539712 | 12/2010 |
| KR | 10-0847306 | 7/2008 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Keon Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25 2010, 6 pages.
Authorized officer Chung Keun Lee, International Search Report and Written Opinion in PCT/US2008/076199, mailed Mar. 24, 2009, 11 pages.
Authorized officer Dorothée Mülhausen, International Preliminary Report on Patentability in PCT/US2008/076199, mailed Apr. 1, 2010, 6 pages.
Authorized officer Chung Keun Lee, International Search Report and Written Opinion in PCT/US2008/076030, mailed Mar. 23, 2009, 10 pages.
Authorized officer Yolaine Cussac, International Preliminary Report on Patentability in PCT/US2008/076030, Mar. 25, 2010, 5 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability, in PCT/US2009/041304, mailed Nov. 4, 2010, 8 pages.

(56) References Cited

OTHER PUBLICATIONS

Authorized officer Sung Hee Kim, International Search Report and the Written Opinion in PCT/US2009/057554, mailed May 10, 2010, 13 pages.
Authorized Officer Gijsbertus Beijer, International Preliminary Report on Patentability in PCT/US2009/057554, mailed Mar. 29, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sung Chan Chung, International Search Report and Written Opinion for PCT/US2010/021824, mailed Aug. 23, 2010, 9 pages.
Authorized officer Beate Giffo-Schmitt, International Preliminary Report on Patentability in PCT/US2010/021824, mailed Aug. 23, 2010, 6 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.
Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Sang-Taek Kim, International Search Report and Written Opinion in PCT/US2011/061407, mailed May 22, 2012, 10 pages.
Authorized officer Lingfei Bai, International Preliminary Report on Patentability in PCT/US2011/061407, mailed Jun. 6, 2013, 7 pages.
Authorized officer Kwan Sik Sul, International Search Report and Written Opinion in PCT/US2011/063975, mailed May 18, 2012, 8 pages.
Authorized officer Simin Baharlou, International Preliminary Report on Patentability in PCT/US2011/063975, mailed Jun. 27, 2013, 5 pages.
Authorized officer Kwan Sik Sul, International Search Report and Written Opinion in PCT/US2012/023160, mailed May 24, 2012, 9 pages.
Authorized officer Simin Baharlou, International Preliminary Report on Patentability in PCT/US2012/023160, mailed Aug. 15, 2013, 6 pages.
Authorized officer Jeongmin Choi, International Search Report and Written Opinion in PCT/US2012/027146, mailed Sep. 24, 2012, 12 pages.
Authorized officer Athina Nickitas-Etienne, International Preliminary Report on Patentability in PCT/US2012/027146, mailed Sep. 19, 2013, 9 pages.
Authorized officer Tae Hoon Kim, International Search Report and Written Opinion in PCT/US2013/035837, mailed Jul. 30, 2013, 9 pages.
Authorized officer Hye Lyun Park, International Search Report and Written Opinion in PCT/US2013/050914, mailed Oct. 18, 2013, 11 pages.
European Search Report in Application No. 10 81 5813.0, mailed Mar. 13, 2012, 9 pages.
Search Report and Action in TW Application No. 098132132, issued Dec. 6, 2012, 8 pages.

SIPO First Office Action for Application No. 200880120050.6, Aug. 2, 2011, 8 pages.
SIPO First Office Action for Application No. 200980114639.X, May 14, 2012, 13 pages.
Ando et al., "10-W/mm AlGaN-GaN HFET with a Field Modulating Plate," IEEE Electron Device Letters, 2003, 24(5):289-291.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Chen et al., "High-performance AlGaN/GaN Lateral Field-effect Rectifiers Compatible with High Electron Mobility Transistors," Applied Physics Letters, 2008, 92, 253501-1-3.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic ON-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al., "The Effect of Surface Passivation on the Microwave Characteristics of Undoped AlGaN/GaN HEMT's," IEEE Electron Device Letters, 2000, 21(6):268-270.
Gu et al., "AlGaN/GaN MOS Transistors using Crystalline $ZrO_2$ as Gate Dielectric," Proceedings of SPIE, 2007, vol. 6473, 64730S-1-8.
Higashiwaki et al. "AlGaN/GaN Heterostructure Field-Effect Transistors on 4H-SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN-GaN Junctions with Ultrathin AlN Interlayers: Expanding Heterojunction Design." Applied Physics Letters, 2002, 80(23):4387-4389.
Keller et al., "Method for Heteroepitaxial Growth of High Quality N-Face GaN, InN and AlN and their Alloys by Metal Organic Chemical Vapor Deposition," U.S. Appl. No. 60/866,035, filed Nov. 15, 2006, 31 pages.
Khan et al., "AlGaN/GaN Metal Oxide Semiconductor Heterostructure Field Effect Transistor," IEEE Electron Device Letters, 2000, 21(2):63-65.
Kim, "Process Development and Device Characteristics of AlGaN/GaN HEMTs for High Frequency Applications," PhD Thesis, University of Illinois at Urbana-Champaign, 2007, 120 pages.
Kumar et al., "High Transconductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage, " Electronic Letters, 2005, 41(7):449-450.

(56) References Cited

OTHER PUBLICATIONS

Lee et al., "Self-aligned Process for Emitter- and Base-regrowth GaN HBTs and BJTs," Solid-State Electronics, 2001, 45:243-247.

Mishra et al., "N-face High Electron Mobility Transistors with Low Buffer Leakage and Low Parasitic Resistance," U.S. Appl. No. 60/908,914, filed Mar. 29, 2007, 21 pages.

Mishra et al., "Polarization-induced Barriers for N-face Nitride-based Electronics," U.S. Appl. No. 60/940,052, filed May 24, 2007, 29 pages.

Mishra et al., "Growing N-polar III-nitride structures," U.S. Appl. No. 60/972,467, filed Sep. 14, 2007, 7 pages.

Mishra et al., "AlGaN/GaN HEMTs—An Overview of Device Operation and Applications," Proceedings of the IEEE, 2002, 90(6):1022-1031.

Nanjo et al., "Remarkable Breakdown Voltage Enhancement in AlGaN Channel High Electron Mobility Transistors," Applied Physics Letters 92 (2008), 3 pages.

Napierala et al. (2006), "Selective GaN Epitaxy on Si(111) Substrates Using Porous Aluminum Oxide Buffer Layers," Journal of the Electrochemical Society, 153(2):G125-G127, 4 pages.

Ota and Nozawa, "AlGaN/GaN Recessed MIS-gate HFET with High-threshold-voltage Normally-off Operation for Power Electronics Applications," IEEE Electron Device Letters, 2008, 29(7):668-670.

Palacios et al., "AlGaN/GaN HEMTs with an InGaN-based Back-barrier," Device Research Conference Digest, 2005, DRC '05 63rd, pp. 181-182.

Palacios et al., "AlGaN/GaN High Electron Mobility Transistors with InGaN Back-Barriers," IEEE Electron Device Letters, 2006, 27(1):13-15.

Palacios et al., "Fluorine Treatment to Shape the Electric Field in Electron Devices, Passivate Dislocations and Point Defects, and Enhance the Luminescence Efficiency of Optical Devices," U.S. Appl. No. 60/736,628, filed Nov. 15, 2005, 21 pages.

Palacios et al., "Nitride-based High Electron Mobility Transistors with a GaN Spacer," Applied Physics Letters, 2006, 89:073508-1-3.

Pei et al., "Effect of Dielectric Thickness on Power Performance of AlGaN/GaN HEMTs," IEEE Electron Device Letters, 2009, 30(4):313-315.

"Planar, Low Switching Loss, Gallium Nitride Devices for Power Conversion Applications," SBIR N121-090 (Navy), 3 pages.

Rajan et al., "Advanced Transistor Structures Based on N-face GaN," 32M International Symposium on Compound Semiconductors (ISCS), Sep. 18-22, 2005, Europa-Park Rust, Germany, 2 pages.

Saito et al., "Recess-gate Structure Approach Toward Normally Off High-voltage AlGaN/GaN HEMT for Power Electronics Applications," IEEE Transactions on Electron Device, 2006, 53(2):356-362.

Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.

Shen, "Advanced Polarization-based Design of AlGaN/GaN HEMTs," Jun. 2004, PhD Thesis, University of California, Santa Barbara, 191 pages.

Sugiura et al., "Enhancement-mode $n$-channel GaN MOSFETs Fabricated on $p$-GaN Using $HfO_2$ as Gate Oxide," Electronics Letters, 2007, vol. 43, No. 17, 2 pages.

Suh et al., "High Breakdown Enhancement Mode GaN-based HEMTs with Integrated Slant Field Plate," U.S. Appl. No. 60/822,886, filed Aug. 18, 2006, 16 pages.

Suh et al. "High-Breakdown Enhancement-Mode AlGaN/GaN HEMTs with Integrated Slant Field-Plate" Electron Devices Meeting, 2006, IEDM '06 International, 3 pages.

Suh et al., "III-Nitride Devices with Recessed Gates," U.S. Appl. No. 60/972,481, filed Sep. 14, 2007, 18 pages.

Vetury et al., "Direct Measurement of Gate Depletion in High Breakdown (405V) Al/GaN/GaN Heterostructure Field Effect Transistors," IEDM 98, 1998, pp. 55-58.

Tipirneni et al. "Silicon Dioxide-encapsulated High-Voltage AlGaN/GaN HFETs for Power Switching Applications," IEEE Electron Device Letters, 2007, 28(9):784-786.

Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.

Wang et al., "Enhancement-mode $Si_3N_4$/AlGaN/GaN MISHFETs," IEEE Electron Device Letters, 2006, 27(10):793-795.

Wu, "AlGaN/GaN Microwave Power High-Mobility Transistors," PhD Thesis, University of California, Santa Barbara, Jul. 1997, 134 pages.

Wu et al., "A 97.8% Efficient GaN HEMT Boost Converter with 300-W Output Power at 1MHz," Electronic Device Letters, 2008, IEEE, 29(8):824-826.

Yoshida, "AlGan/GaN Power FET," Furukawa Review, 2002, 21:7-11.

Zhang, "High Voltage GaN HEMTs with Low On-resistance for Switching Applications," PhD Thesis, University of California, Santa Barbara, Sep. 2002, 166 pages.

Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.

* cited by examiner

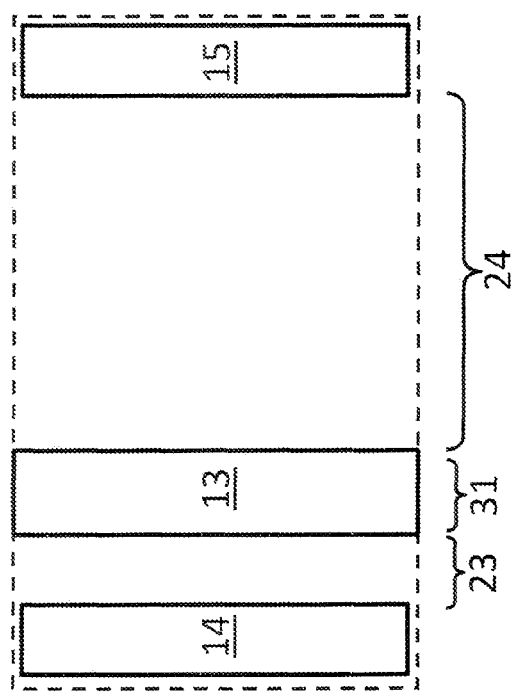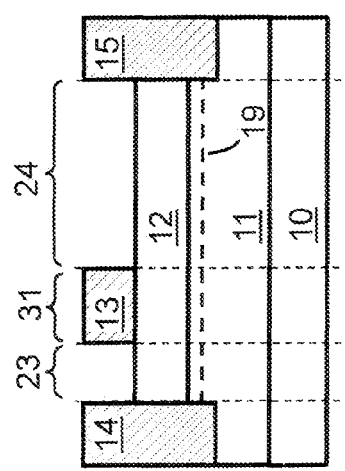

SEMICONDUCTOR DEVICES WITH INTEGRATED HOLE COLLECTORS

TECHNICAL FIELD

Semiconductor electronic devices and components, in particular nitride-based transistors and diodes with improved reliability, are described.

BACKGROUND

To date, most transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). While Si power devices are inexpensive, they suffer from a number of disadvantages, including relatively low switching speeds and high levels of electrical noise. More recently, silicon carbide (SiC) power devices have been considered due to their superior properties. III-Nitride or III-N semiconductor devices, such as gallium nitride (GaN) devices, are now emerging as attractive candidates to carry large currents, support high voltages, and to provide very low on-resistance and fast switching times.

FIGS. 1A and 1B illustrate a plan view and a cross-sectional view, respectively, of a III-N transistor of the prior art having source electrode 14, drain electrode 15, gate electrode 13, and access regions 23 and 24. As used herein, the "access regions" of a transistor refer to the two regions between the source and gate electrodes, and between the gate and drain electrodes of the transistor, i.e., regions 23 and 24, respectively, in FIGS. 1A and 1B. Region 23, the access region on the source side of the gate, is typically referred to as the source access region, and region 24, the access region on the drain side of the gate, is typically referred to as the drain access region. As used herein, the "gate region" 31 of a transistor refers to the portion of the transistor between the two access regions 23 and 24 in FIGS. 1A and 1B.

While numerous III-N transistors and diodes have been demonstrated, improvements in device reliability are still necessary in order to enable large scale manufacturing and more widespread adoption of these devices. In particular, in III-N devices configured to support high voltages and/or large currents, large electric fields present in the device during operation can lead to deleterious effects such as threshold voltage shifts and breakdown, as well as other effects that degrade device performance or otherwise render the device inoperable. Device structures that reduce such degradation and improve device reliability are therefore desirable.

SUMMARY

Transistor devices which include semiconductor layers with integrated hole collector regions are described. The hole collector regions are configured to collect holes generated in the transistor device during operation and transport them away from the active regions of the device. The hole collector regions can be electrically connected or coupled to the source, the gate, the drain, or a field plate of the device. The hole collector regions can be doped, for example p-type or nominally p-type, and can be capable of conducting holes. In some cases, the hole collector regions are capable of conducting holes but not electrons.

In one aspect, a transistor device comprising a source, a gate, and a drain is described. The transistor device includes a semiconductor material which includes a gate region between the source and the drain, and a plurality of channel access regions in the semiconductor material between the source and the gate, and between the drain and the gate, respectively. The transistor device further includes a channel in the semiconductor material and an insulating material over the semiconductor material, the insulating material having a first portion over the gate region and a second portion over at least one of the plurality of channel access regions, with a thickness of the first portion being less than a thickness of the second portion. The transistor device also includes one or more hole collector regions at least partially in the gate region of the semiconductor material. Furthermore, the insulating material is between the gate and the semiconductor material and prevents the gate from contacting the semiconductor material in the gate region.

In another aspect, a transistor device is described. The transistor device includes an electrode, a semiconductor material which includes a gate region between two channel access regions, a channel in the semiconductor material, an insulating material over the semiconductor material, and a hole collector region in the semiconductor material below the electrode. The insulating material is between the electrode and the hole collector region and prevents the electrode from contacting the hole collector region, and at least a portion of the insulating material that is between the electrode and the hole collector region is sufficiently thin to allow holes generated during device operation to be collected by the electrode.

In yet another aspect, a transistor device is described. The transistor device includes a gate and a III-N semiconductor material which includes a gate region beneath the gate, the gate region including a first portion having a first area and a second portion having a second area. The transistor device further includes a channel in the III-N semiconductor material and an insulating material over the III-N semiconductor material. The insulating material is over the first portion of the gate region but not over the second portion of the gate region, the gate contacts the III-N semiconductor material in the second portion of the gate region but not in the first portion of the gate region, and the first area is greater than the second area.

In still another aspect, a transistor device is described. The transistor device includes a III-N semiconductor material layer, an insulating layer over the III-N semiconductor material layer, a source, a gate, a drain, and a gate region beneath the gate. The insulating layer is between the gate and the III-N semiconductor material layer in a first portion of the gate region, with the first portion of the gate region having a first area. Furthermore, the insulating layer includes one or more apertures, the one or more apertures being in a second portion of the gate region, the second portion of the gate region having a second area. The first area is greater than the second area.

In yet another aspect, a transistor device is described. The transistor device includes a source, a gate, a drain, a semiconductor material which includes a gate region between the source and the drain, a channel in the semiconductor material, an insulating material between the gate and the semiconductor material, and a field plate over the insulating material. An electrically conductive portion extending from the source or from the field plate contacts the semiconductor material, and the transistor device is an enhancement-mode transistor.

In still another aspect, a transistor device is described. The transistor device includes a source, a gate, a drain, a semiconductor material which includes a gate region between the source and the drain, a channel in the semiconductor material, an insulating material between the gate and the semiconductor material, a field plate over the insulating material, an electrically conductive portion electrically connected to the source or to the field plate, and a hole collector region in the gate region of the semiconductor material. A resistance between the electrically conductive portion and the hole collector region is less than a resistance between the gate and the hole collector region.

In yet another aspect, a transistor device is described. The transistor device includes a source, a gate, a drain, a semiconductor material which includes a gate region between the source and the drain, a channel in the semiconductor material, an insulating material between the gate and the semiconductor material, a field plate over the insulating material, an electrically conductive portion electrically connected to the source or to the field plate, and a doped portion at least partially in the gate region of the semiconductor material. A resistance to hole current flow between the electrically conductive portion and the doped portion is less than a resistance to hole current flow between the gate and the doped portion.

In still another aspect, a transistor device is described. The transistor device includes a gate and a III-N semiconductor material which includes a gate region beneath the gate, the gate region including a first portion having a first area and a second portion having a second area. The transistor device further includes a channel in the III-N semiconductor material and an insulating material over the first and second portions of the gate region. The insulating material is thicker over the first portion of the gate region than over the second portion of the gate region, and the first area is greater than the second area.

In yet another aspect, a transistor device is described. The transistor device includes a source, a gate, a drain, a semiconductor material which includes a gate region adjacent to the gate, a channel in the semiconductor material, and one or more doped regions at least partially in the gate region of the semiconductor material. The transistor device is configured to block at least 480V for 500 hours or more when a gate-source voltage less than a device threshold voltage is applied to the transistor device.

In still another aspect, a method of forming a transistor device is described. The method includes providing a III-N semiconductor material and forming a source, a gate, and a drain on the III-N semiconductor material, where the III-N semiconductor material includes a gate region between the source and the drain and a plurality of channel access regions between the source and the gate, and between the drain and the gate, respectively. The method further includes doping a portion of the III-N semiconductor material, wherein the portion is at least partially in the gate region, and forming an insulating material over the III-N semiconductor material, the insulating material having a first portion over the gate region and a second portion over at least one of the plurality of channel access regions, a thickness of the first portion being less than a thickness of the second portion. The insulating material is between the gate and the semiconductor material and prevents the gate from contacting the semiconductor material in the gate region.

For all transistor devices and methods described herein, one or more of the following may be applicable. The first portion of the insulating material can be sufficiently thin to allow holes generated during device operation to be collected by the gate. The first portion of the insulating material can be sufficiently thin to allow holes generated during device operation to be transported out of the semiconductor material through the gate. The device can include at least two hole collector regions in the gate region of the semiconductor material. The hole collector region can contains dopants, and the dopants can be selected from the group consisting of Mg, Al, and Fe. The device can be a III-N transistor, a high-voltage device, and/or a field-effect transistor.

The insulating material can comprise a first insulating material layer and a second insulating material layer. The second portion of the insulating material can include both the first and second insulating material layers, and the first portion of the insulating material can include the first insulating material layer but not the second insulating material layer. The insulating material can be over an entirety of the one or more hole collector regions. The one or more hole collector regions can be configured to conduct substantial hole current but not substantial electron current. The maximum hole current density that the one or more hole collector regions are configured to conduct can be at least 100 times the maximum electron current density that the one or more hole collector regions are configured to conduct.

The portion of the insulating material that is between the electrode and the hole collector region is sufficiently thin to allow holes generated during device operation to be transported out of the semiconductor material through the electrode. The electrode can be a gate, and the transistor can further comprise a source and a drain. The portion of the insulating material that is between the electrode and the hole collector region can be a first portion, the insulating material comprising a second portion between the gate and the drain, with the first portion being thinner than the second portion. The insulating material can prevent the electrode from contacting the semiconductor material. The semiconductor material can include a III-N material. The hole collector region can contain dopants, which can be selected from the group consisting of Mg, Al, and Fe.

The first area can be at least two times, at least four times, or at least ten times the second area. The III-N semiconductor material can include one or more hole collector regions in the gate region of the III-N semiconductor material, and the one or more hole collector regions can be at least partially in the second portion of the gate region. The transistor can further comprising a source and a drain on opposite sides of the gate, and a plurality of channel access regions in the III-N semiconductor material between the source and the gate, and between the drain and the gate, respectively. A portion of the insulating material that is over at least one of the plurality of access regions can be thicker than a portion of the insulating material that is over the first portion of the gate region. The insulating material over the first portion of the gate region can be between the gate and the III-N semiconductor material. The insulating material can include a first insulating material and a second insulating material. The transistor can further include a source and a drain on opposite sides of the gate, and a plurality of channel access regions in the III-N semiconductor material between the source and the gate, and between the drain and the gate, respectively. The insulating material that is over at least one of the plurality of access regions can include both the first and second insulating materials, and the insulating material that is over the first portion of the gate region can include the first insulating material but not the second insulating material. The second portion of the gate region can include a plurality of portions, and the second area is a total area of the plurality of portions.

At least one of the gate, the source, and the drain can be at least partially in at least one of the one or more apertures. At least one of the gate, the source, and the drain can contact the III-N semiconductor material layer in the second portion of the gate region. The insulating material can prevent the gate from contacting the semiconductor material in the gate region. The field plate can be electrically connected to the source. In operation, the channel may not be conductive when 0V is applied to the gate relative to the source and a voltage greater than 0V is applied to the drain relative to the source, but can be conductive when a switching voltage greater than a device threshold voltage is applied to the gate relative to the source. The transistor device can further include a hole collector region in the gate region of the semiconductor material, wherein the electrically conductive portion contacts the hole collector region. In a first mode of operation, the transistor device can be operable to block a positive voltage applied to the drain relative to the source when 0V is applied to the gate relative to the source, and in a second mode of operation, the device can be operable to conduct current from the source to the drain when 0V is applied to the gate relative to the source and the drain is at a negative voltage relative to the source. The contact between the electrically conductive portion and the hole collector region can have a turn-on voltage, wherein the turn-on voltage is sufficiently large to prevent substantial current from flowing through the contact between the electrically conductive portion and the hole collector region during the second mode of operation. The semiconductor material can include a III-N channel layer and a III-N barrier layer, the channel being in the III-N channel layer adjacent to the III-N barrier layer.

The electrically conductive portion can extend towards the hole collector region without contacting the hole collector region. A separation between the electrically conductive portion and the hole collector region can be less than or equal to a separation between the gate and the hole collector region. The insulating material can prevent the gate from contacting the semiconductor material in the gate region. The device can be an enhancement-mode transistor. A threshold voltage of the transistor device may not be substantially altered after the blocking of at least 480V for 500 hours or more.

Particular embodiments of the subject matter described in this specification can be implemented so as to realize one or more of the following advantages. Compared to some conventional semiconductor devices, the devices described herein can have improved reliability, longer lifespan, or both. For example, the devices described herein can be operable after blocking at least 480V for 500 hours or more, or 1000 hours or more, with a gate-source voltage less than the device threshold voltage applied to the transistor device

DESCRIPTION OF DRAWINGS

FIG. 1A is a plan view of a prior art III-Nitride device.

FIG. 1B is a cross-sectional view of the device of FIG. 1A.

Like reference symbols in the various drawings indicate like elements.

DETAILED DESCRIPTION

Described herein are III-Nitride (i.e., III-N) semiconductor devices that include integrated hole collectors or hole collector regions. The hole collectors are configured to collect holes generated in the device during operation, for example holes generated during high voltage and/or high current operation, and facilitate the removal of the holes from active regions within the device. The generation of holes in the devices can lead to threshold voltage shifts, reduction in device reliability, and other undesirable effects. Thus, collection and removal of the holes may be necessary for reliable operation of the devices.

As used herein, the terms III-Nitride or III-N materials, layers, devices, structures, etc., refer to a material, device, or structure comprised of a compound semiconductor material according to the stoichiometric formula $B_w Al_x In_y Ga_z N$, where w+x+y+z is about 1, and w, x, y, and z are each greater than or equal to zero and less than or equal to 1. In a III-Nitride or III-N device, the conductive channel can be partially or entirely contained within a III-N material layer.

Figure 2:
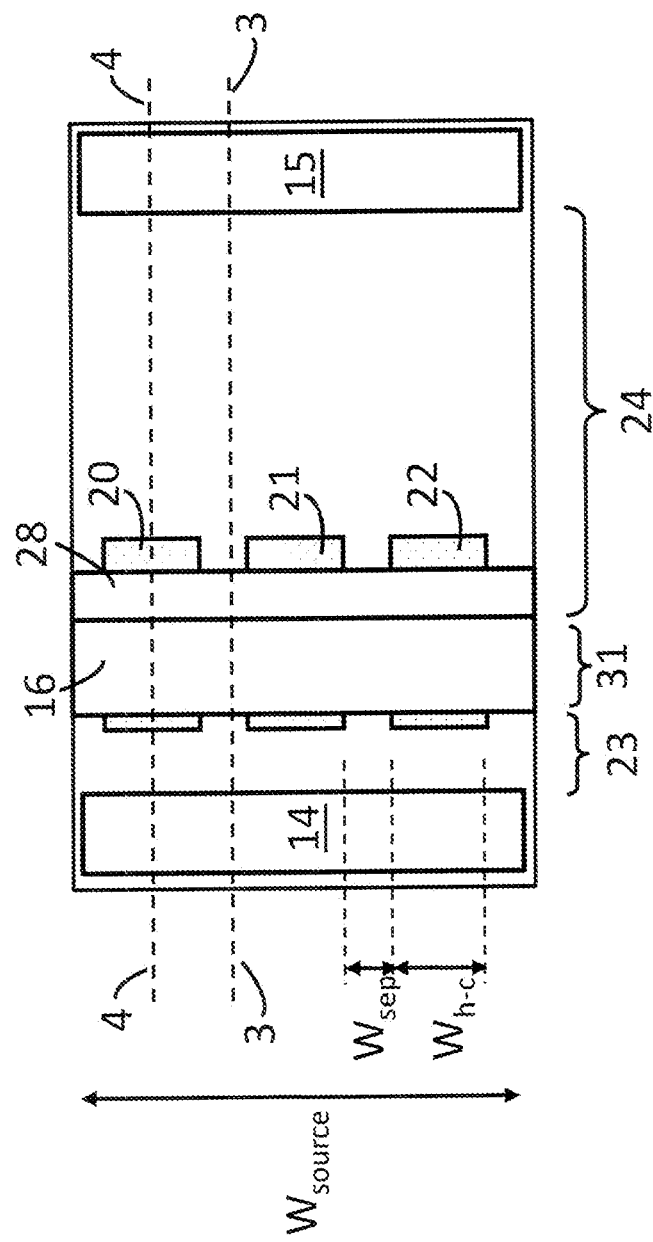
FIG. 2 is a plan view of a device according to this specification.
Figure 3:
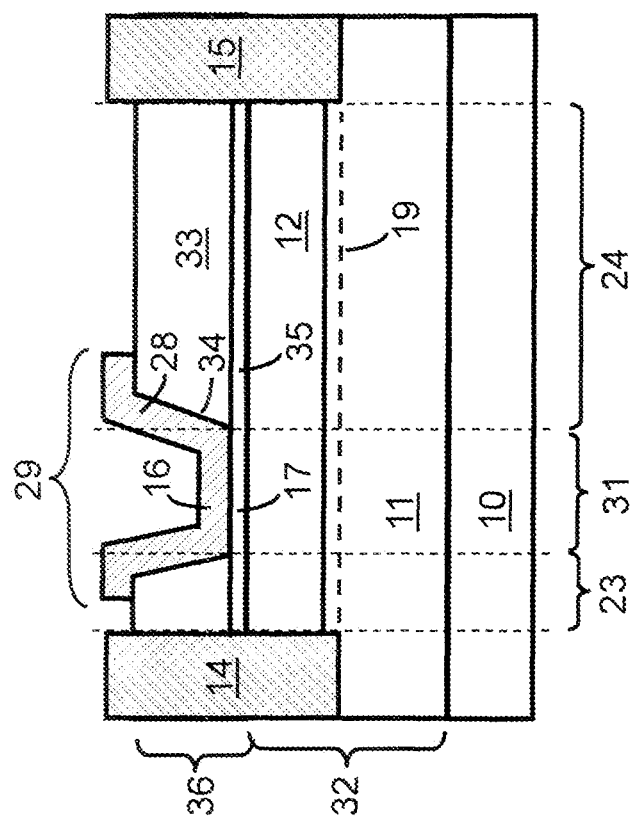
FIG. 3 is a cross-section through the cut 3-3 of the device of FIG. 2.
Figure 4:
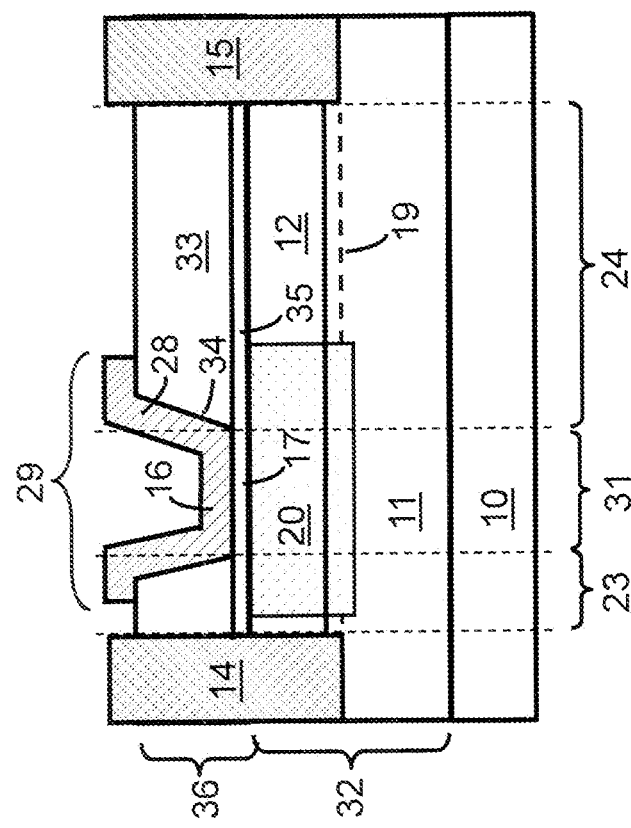
FIG. 4 is a cross-section through the cut 4-4 of the device of FIG. 2.

FIGS. 2-4 illustrate an exemplary III-N transistor device, i.e., a III-N high electron mobility transistor (HEMT), which includes one or more hole collector regions which are at least partially below the transistor gate. FIG. 2 is a plan view (top view) of the device, FIG. 3 is a cross-sectional view along dashed line 3 in FIG. 2, and FIG. 4 is a cross-sectional view along dashed line 4 in FIG. 2. The transistor is a unipolar device; that is, electrical current flowing through the device is dominated by current of a single carrier type. In the example illustrated in FIGS. 2-4, the current passing through the device channel is predominantly an electron current. Alternatively, unipolar transistors for which channel current is predominantly a hole current are possible as well, although such devices would include electron collector regions in place of the hole collector regions described herein. While the current through the transistor of FIGS. 2-4 is predominantly an electron current, holes can be generated in the device III-N material layers during device operation, in particular during times when the device is operated under high voltage and/or high current conditions.

The transistor of FIGS. 2-4 includes hole collector regions 20, 21, and 22 (best seen in FIG. 2) between the source 14 and the drain 15. The hole collector regions are configured to collect the holes that are generated in the transistor during operation. Optionally, the hole collector regions can also be configured to increase or maximize the short-circuit survival time of the transistor by reducing or minimizing the maximum channel current (short-circuit current) $I_{max}$ that can flow through the device, while maintaining an acceptably low on-resistance. In applications in which the hole collector regions also serve to limit the maximum channel current that can flow through the device, the hole collector regions may need to at least be under the side of the gate 16 that is closest to the source 14. That is, the hole collector regions can each include a first portion which is in the source access region 23 and a second portion which is in the gate region 31, as illustrated in FIG. 2. Optionally, as also illustrated in FIG. 2, the hole collector regions can also extend into the drain access region 24; that is, they can include a third portion which is in the drain access region 24. In devices with shorter gate lengths, having the hole collector regions 20-22 extend into the drain access region 24 can result in the device being more easily manufacturable.

As shown in the cross-sectional views of FIGS. 3 and 4, the transistor device includes a substrate 10 (which may optionally be omitted), a semiconductor material structure 32, and a conductive channel 19, such as a two-dimensional electron gas (2DEG), in the semiconductor material structure 32. The semiconductor material structure 32 includes a III-N channel layer 11 and a III-N barrier layer 12, where the compositions of layers 11 and 12 are selected to induce a 2DEG in the III-N channel layer 11 near the interface between the III-N channel layer 11 and the III-N barrier layer 12. The transistor further includes an insulating material 36, which includes a first insulating material layer 35 and a second insulating material layer 33. Alternatively, insulating material layers could be formed of the same insulating material, such that together they constitute a single material layer. The first insulating material layer 35 includes a gate insulator portion 17 in the gate region 31 beneath the gate 16 of the device, while the second insulating material layer 33 is in access regions 23 and 24 of the device. The transistor also includes a source 14, a drain 15, a gate 16, and a field plate 28. The gate 16 and field plate 28 are shown to be directly connected and together form electrode 29. However, they can alternatively be isolated from one another, such that they are not directly connected.

The slant field plate 28 shown in FIGS. 2-4 is formed of the same conducting material as the gate contact 16. Examples of such conducting materials are Ni, Pt, poly-silicon, Al, Ti, Au, or combinations thereof. Field plates can be used in semiconductor devices, such as transistors, to shape the electric field in the high-field region of the device in such a way that reduces the peak electric field and increases the device breakdown voltage, thereby allowing for higher voltage operation. A field plate does not necessarily need to be formed of the same material as the gate, and it does not necessarily need to be connected to the gate; in some cases, it can be connected to the source, the drain, an electrical ground or a DC voltage source. Insulating material layer 33 (shown in FIGS. 3-4) at least partially defines the geometry of the gate and field plate structures. In the implementation shown in FIG. 3, for example, the insulating material layer 33 includes a slanted edge 34 on the drain side of the gate, and the field plate 28 is on top of and contacting slanted edge 34. Hence the field plate 28 is a "slant field plate". The slanted edge 34 includes at least a substantial portion which is at a non-perpendicular angle to a main surface of the semiconductor material structure 32. Alternative field plate structures to a slant field plate may also be used.

The transistor in FIGS. 2-4 is a lateral device, having source and drain electrodes 14 and 15, respectively, on the same side of the semiconductor material structure 32. However, the transistor could be modified to be a vertical device, in which the drain 15 is on an opposite side of the semiconductor material structure 32 from the source. The device may further be any type of field effect transistor, and can be an enhancement-mode device (threshold voltage>0V), a depletion-mode device (threshold voltage<0V), a high-voltage device, or any combination of these devices. The device can be a III-polar (III-face) device, an N-polar (N-face) device, a non-polar, or a semipolar device. A Ga-face, III-face, or III-polar III-N device can include III-N materials grown with a group III-face or [0 0 0 1] face on an opposite side of the III-N materials from the growth substrate, or can include source, gate, and/or drain electrodes on a group III-face or [0 0 0 1] face of the III-N materials. A nitrogen-face, N-face, or N-polar III-N device can include III-N materials grown with an N-face or [0 0 0 1 bar] face on an opposite side of the III-N materials from the growth substrate, or can include source, gate, and/or drain electrodes on an N-face or [0 0 0 1 bar] face of the III-N materials.

Most conventional III-N high electron mobility transistors (HEMTs) and related transistor devices are normally on, i.e., have a negative threshold voltage, which means that they can conduct current when zero voltage is applied to the gate relative to the source. These devices with negative threshold voltages are known as depletion-mode (D-mode) devices. It can be preferable in some power electronics applications to have normally-off devices, i.e., devices with positive threshold voltages, that cannot conduct current when the gate and the source are at the same voltage, in order to avoid damage to the device or to other circuit components by preventing accidental turn-on of the device. Normally-off devices are commonly referred to as enhancement-mode (E-mode) devices. While the device illustrated in FIGS. 2-4 is a depletion-mode transistor, the structure could be modified to form an enhancement-mode transistor. For example, III-N barrier layer 12 could be recessed in the gate region 31, such that the 2DEG channel 19 is depleted of electrons in the gate region 31 at zero gate bias (relative to the source) but is not depleted when a sufficiently high positive voltage is applied to the gate 16 relative to the source 14.

As used herein, a "high-voltage device", such as a high-voltage transistor, is an electronic device which is optimized for high-voltage switching applications. That is, when the transistor is off, it is capable of blocking high voltages, such as about 300V or higher, about 600V or higher, about 1200V or higher, or about 1700V or higher, and when the transistor is on, it has a sufficiently low on-resistance ($R_{ON}$) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, or other suitable blocking voltage required by the application. In other words, a high-voltage device can block any voltage between 0V and at least $V_{max}$, where $V_{max}$ is the maximum voltage that could be supplied by the circuit or power supply. In some implementations, a high-voltage device can block any voltage between 0V and at least $2*V_{max}$.

When a semiconductor device such as a transistor is operated in the off state, large electric fields may be present in the material layers, especially when the device is used in high-voltage applications. These large electric fields can result in the creation of holes, such as by impact ionization, in regions in which these electric fields are large. The holes, which have a positive electrical charge, migrate within the device structure towards regions of low electric potential (i.e., low voltage). The presence of these positively charged holes can lead to shifts in the device threshold voltage, increase in electron injection across the gate insulator, reduced reliability, and other undesirable effects. Hence, it is desirable to minimize or eliminate the effects of these holes.

Referring back to FIG. 2, hole collector regions 20-22 are regions through which holes generated during device operation are collected. These holes can be passed to the gate 16 after being collected. Regions 20-22 can be doped, such as with Al, Mg, or Fe ions, for example by ion-implantation, and may be p-type, nominally p-type, or electrically insulating. As seen in FIG. 4, regions 20-22 can extend through the channel region, thereby forming a break in the 2DEG channel 19. Regions 20-22 may be capable of conducting substantial hole currents, but not substantial electron currents. That is, in some implementations the maximum hole current density that can be conducted through regions 20-22 is at least 100 times the maximum electron current density that can be conducted through regions 20-22.

Hole collector regions 20-22 can be placed in regions of high electric field, or in the vicinity of regions of high electric fields, within the device. Since holes may be generated in regions where high electric fields exist during device operation, placing a hole collector region near the region where the holes are generated can improve hole collection efficiency. Examples of regions that typically have high electric fields (i.e., fields that are substantially larger, for example more than 10 times larger, than the average field in the vicinity of the source, gate, and drain electrodes) during device operation include the regions between the gate and the drain electrode, particularly near the drain-side edge of the gate electrode, or near or beneath the gate or a field plate.

Hole collector regions 20-22 can also be placed in regions of low voltage or low electric potential, or in the vicinity of regions of low voltage or low electric potential. Since holes are drawn towards regions of low voltage or low electric potential, placing a hole collector region near where the holes are drawn to can improve hole collection efficiency. Examples of regions that are typically at low voltage or low electric potential during device operation include regions near or beneath the source electrode, the regions near or beneath the gate electrode, regions near or beneath any of the device field plates, or the regions between the source and the gate electrode. In some cases, regions in the device that are a low electric potential during device operation are also regions that have a high electric field.

Once the holes approach or are incident upon the hole collector regions 20-22, they can be drawn away from the vicinity of the channel or other active regions of the device. For example, in some implementations, the holes can recombine with electrons near to or within the hole collector regions 20-22. In other implementations, a metal electrode, for example a portion of the gate or source, is connected to the surface of a hole collector region, the electrode being at a sufficiently low or negative voltage in order to carry the holes away through the electrode as an electrical current. Since the gate 16 and source 14 are typically at a low or negative voltage when the transistor is in the off state, the voltage on the gate or source may be sufficient to draw the holes away from the vicinity of the device channel or other active regions.

In order for the holes generated during device operation to pass from the hole collector regions 20-22 to the gate 16, it can be necessary for the gate metal 16 to electrically contact at least a portion of the regions 20-22. For example, the gate metal can directly contact the semiconductor material in regions 20-22. Alternatively, as seen in FIG. 4, portion 17 of insulating material 36 (that is, the portion of insulating material 36 that is directly below the gate 16 in the gate region 31) can be sufficiently thin to allow holes collected in regions 20-22 to pass through portion 17 and into the gate 16, although the portions of insulating material 36 that are in or over the access regions 23 and 24 can be made thicker. In this case, at least a portion of each hole collector region 20-22 may need to be in the gate region 31.

In some implementations, keeping portion 17 of insulating material 36 less than 500 nanometers allows holes to be collected by the gate, while in other implementations portion 17 must be thinner than 100 nanometers, 70 nanometers, 50 nanometers, or 30 nanometers. The maximum thickness that region 17 can be made for which the gate 16 is operable to collect holes may depend on the particular material selected for portion 17 of insulating material 36. Typical examples of gate insulators that can be used for portion 17 of insulating material 36 include silicon nitride, silicon oxide, silicon dioxide, or aluminum nitride, although other dielectric materials may be used as well. In some implementations, the semiconductor material structure includes or is formed of III-N materials, and the device is a III-N device, such as a III-N transistor or FET. For example, channel layer 11 can be GaN and barrier layer 12 can be $Al_xGa_{1-x}N$.

Although not shown in FIGS. 2-4, in some implementations the portion of the gate insulator 17 that is directly above the hole collector region 20-22 (e.g., the portion of gate insulator 17 shown in FIG. 4) can be thinned so that its thickness is less than that of the portion of the gate insulator 17 in the remaining parts of the device (e.g., the portion of gate insulator 17 shown in FIG. 3). This can allow for the gate insulator directly above the hole collector regions 20-22 to be thin enough to facilitate hole collection by the gate 16, while at the same time maintaining a thicker gate insulator directly over regions in which the device 2DEG channel is present, which can result in a reduction in gate leakage.

The separation between hole collector regions (labeled $W_{sep}$ in FIG. 2) and the width of the hole collector regions (labeled $W_{h-c}$ in FIG. 2), relative to the source width (labeled $W_{source}$ in FIG. 2) of the device, determine the maximum current level of the device. That is, if a device which is identical to that of FIGS. 2-4 but lacking the hole collector regions 20-22 has a maximum current level $I_0$, the maximum current level of the device of FIGS. 2-4 will equal $I_0^* (W_{source} - \Sigma W_{h-c})/W_{source}$ (where $\Sigma W_{h-c}$ is the sum of the widths of all the hole collector regions). Hence, for a given hole collector width $W_{h-c}$, if a higher maximum current level is desired, $W_{sep}$ should be made larger, whereas for a smaller maximum current level $W_{sep}$ should be made smaller. However, if $W_{sep}$ is made too large, then holes generated directly in between adjacent hole collector regions may not be collected efficiently during device operation. Hence, the separation between hole collector regions cannot be made too large.

A set of III-N transistor devices such as the one illustrated in FIGS. 2-4 were fabricated with a gate length of 4 microns, a 28 nanometer thick SiN gate insulator, a hole collector region width $W_{h-c}$ equal to 2 microns, and a hole collector separation width $W_{sep}$ equal to 8 microns. The hole collector regions 20-22 were formed by ion-implanting aluminum (Al) ions into the III-N material layers. When the devices were subjected to conditions in which the gate-source voltage $V_{GS}$ was set to −30V (such that the devices were in the OFF state, since the gate-source voltage was less than the device threshold voltage), the drain-source voltage $V_{DS}$ was set to 480V (such that the devices were blocking 480V), and the ambient temperature was kept at room temperature (about 25° C.), most of the devices survived (i.e., were still operable) after 500 or more hours under the above conditions, and over half of the devices exhibited an off-state current density smaller than $10^{-4}$ mA/mm, indicating that the threshold voltages of these devices had not shifted substantially. Additionally, over 40% of the devices exhibited an off-state current density smaller than $10^{-4}$ mA/mm after 1000 hours under the above conditions. This result was unexpected and indicated that inclusion of the hole collector regions did in fact substantially improve the reliability of the devices. Furthermore, for a set of devices having a gate length of 1 micron, a hole collector region width $W_{h-c}$ equal to 5 microns, and a hole collector separation width $W_{sep}$ equal to 15 microns, at least 90% of the devices survived and exhibited an off-state current density smaller than $10^{-4}$ mA/mm after 1000 hours under the above conditions.

The above results indicated that a hole collector region separation of 15 microns or less, and/or a ratio $W_{h-c}/(W_{h-c}+$ $W_{sep}$) of 0.2 or larger could result in the efficient collection of holes from the device during operation. Additional tests have indicated that a hole collector region separation of 30 microns or less, and/or a ratio $W_{h-c}/(W_{h-c}+W_{sep})$ of 0.05 or larger can in many cases result in the efficient collection of holes from the device during operation.

Figure 5:
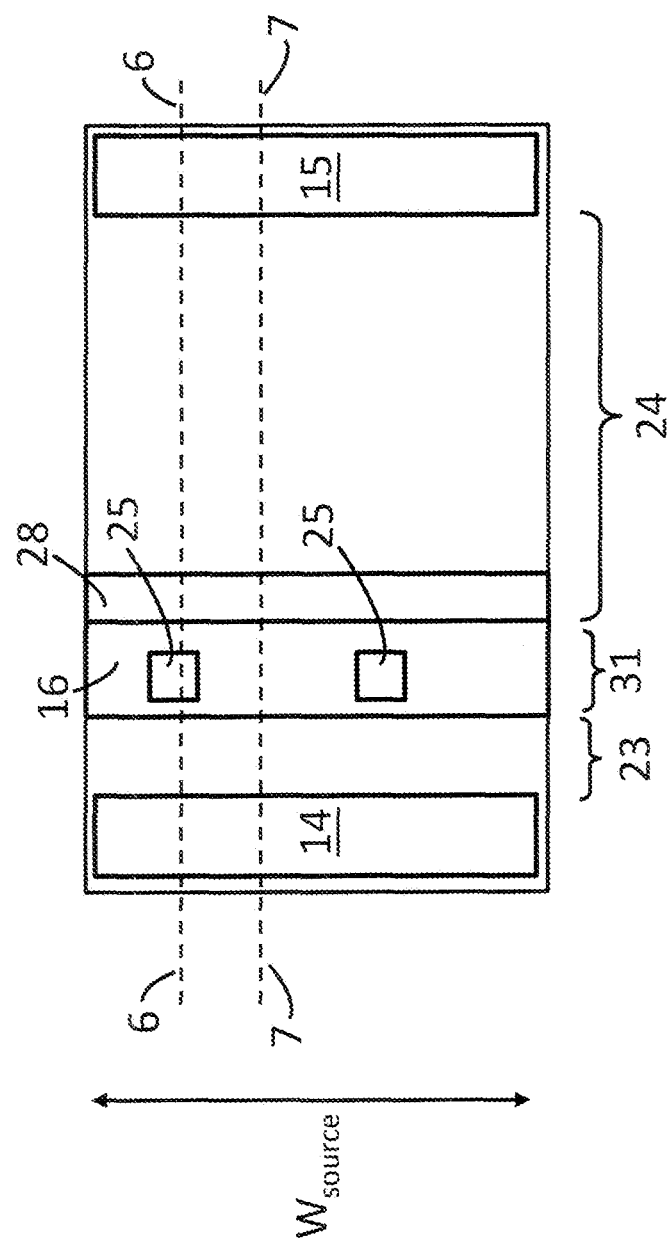
FIG. 5 is a plan view of another device according to this specification.
Figure 6:
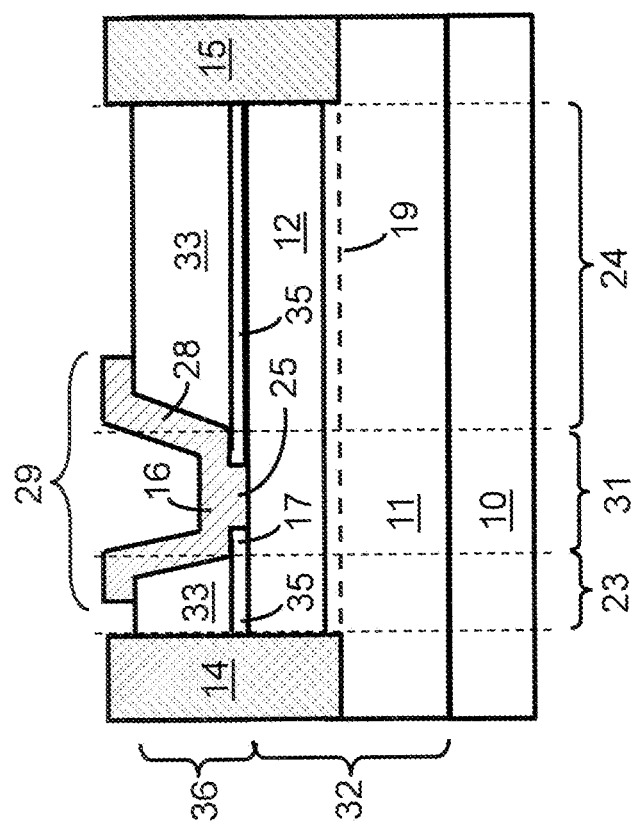
FIG. 6 is a cross-section through the cut 6-6 of the device of FIG. 5.
Figure 7:
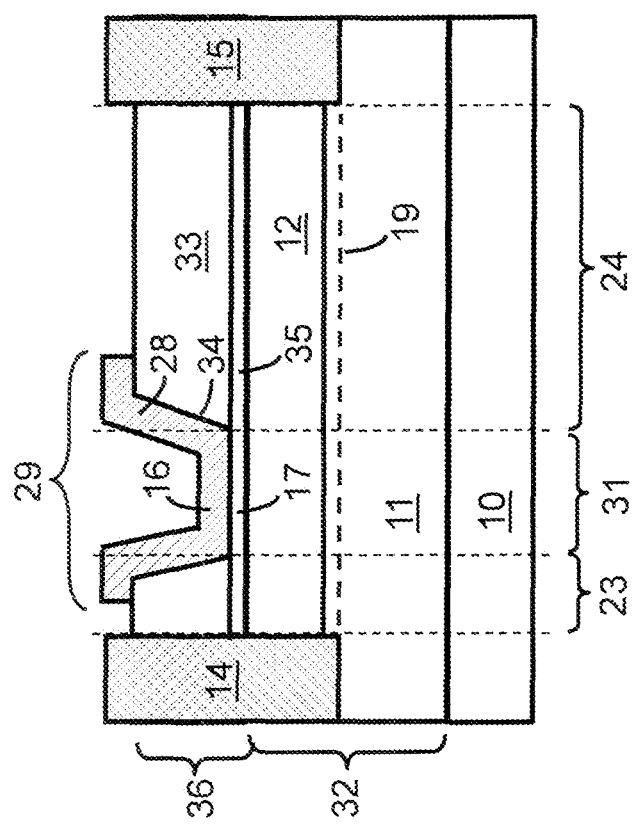
FIG. 7 is a cross-section through the cut 7-7 of the device of FIG. 5.

FIGS. 5-7 illustrate another transistor device for which holes generated during operation can be collected by the gate 16. FIG. 5 is a plan view (top view) of the device, FIG. 6 is a cross-sectional view along dashed line 6 in FIG. 5, and FIG. 7 is a cross-sectional view of the device along dashed line 7 in FIG. 5. The transistor of FIGS. 5-7 is similar to that of FIGS. 2-4, except that hole collector regions 20-22 in the semiconductor material, shown in FIG. 2, are omitted in the device of FIGS. 5-7. Instead, holes generated during device operation are transported into and collected by the gate 16 in portions 25 where the gate insulator 35 is removed and the gate 16 directly contacts and forms a Schottky contact with the underlying semiconductor material, as further described below.

In some III-N transistors, in particular those used in high power or high voltage switching applications, a gate insulator is incorporated between the gate and the underlying semiconductor material in order to reduce gate leakage and/or to prevent premature breakdown of the device. The gate insulator is typically over the entire gate region of the semiconductor layers, with the gate over the gate insulator, such that the gate does not directly contact the underlying semiconductor material. However, in some transistors in which holes are generated during operation, inclusion of a gate insulator which prevents the gate from directly contacting the underlying semiconductor material can also prevent the gate from being able to collect the holes, which can result in device instability and other deleterious effects.

As seen in the transistor of FIGS. 6-7, insulating material 36, which includes both insulating material layers 35 and 33, includes a portion 17 which is underneath the gate 16, i.e., between the gate 16 and the semiconductor material 32. Hence portion 17 acts as a gate insulator, as described above. However, as seen in FIGS. 5-6, the gate region 31 also includes a portion or plurality of portions 25 in which the gate insulator 17 is removed or is not included, and the gate 16 directly contacts and forms a Schottky contact with the underlying semiconductor material 32 in portions 25. Hence, holes generated during operation of the transistor can be collected by the gate in portions 25 of the gate region 31.

While increasing the area of portions 25 can improve efficiency of hole collection, it may also lead to unacceptably high gate-drain leakage currents. The maximum amount of gate-drain leakage that can be tolerated, which at least partially determines the maximum total area of portions 25, depends on the particular application in which the transistor is used. For example, in some applications, sufficiently small leakage currents are achieved when the total area of the gate region outside of portions 25 is greater than the total area of portions 25. However, in applications in which only very small gate-drain leakage currents can be tolerated, the ratio of the total area of the gate region outside of portions 25 to the total area of portions 25 may need to be larger. For example, the total area of the gate region outside of portions 25 can be at least 2 times, at least 4 times, or at least 10 times that of the total area of portions 25.

Optionally, the transistor of FIGS. 5-7 may also include hole collector regions in the semiconductor material (not shown), with properties similar to or the same as hole collector regions 20-22 in FIGS. 2-4. When hole collector regions are used, they can be at least partially in or under portion 25 of the gate region, such that the portion of the gate 16 that directly contacts the semiconductor material 32 also directly contacts the hole collector regions in the semiconductor material.

In an alternative implementation to that shown in FIGS. 5-7, portions 25 can include a thin gate insulator layer between the gate 16 and the underlying semiconductor material layers. For example, referring to FIG. 6, region 25 can include a layer of material 35 between the gate 16 and III-N barrier layer 12, where the thickness of material layer 35 is smaller in region 25 than in the remainder of the gate region 31. The gate insulator material in region 25 can be thin enough to allow for holes to be collected by the gate 16, while at the same time being thick enough to keep gate-drain leakage currents at a sufficiently low level.

Figure 8:
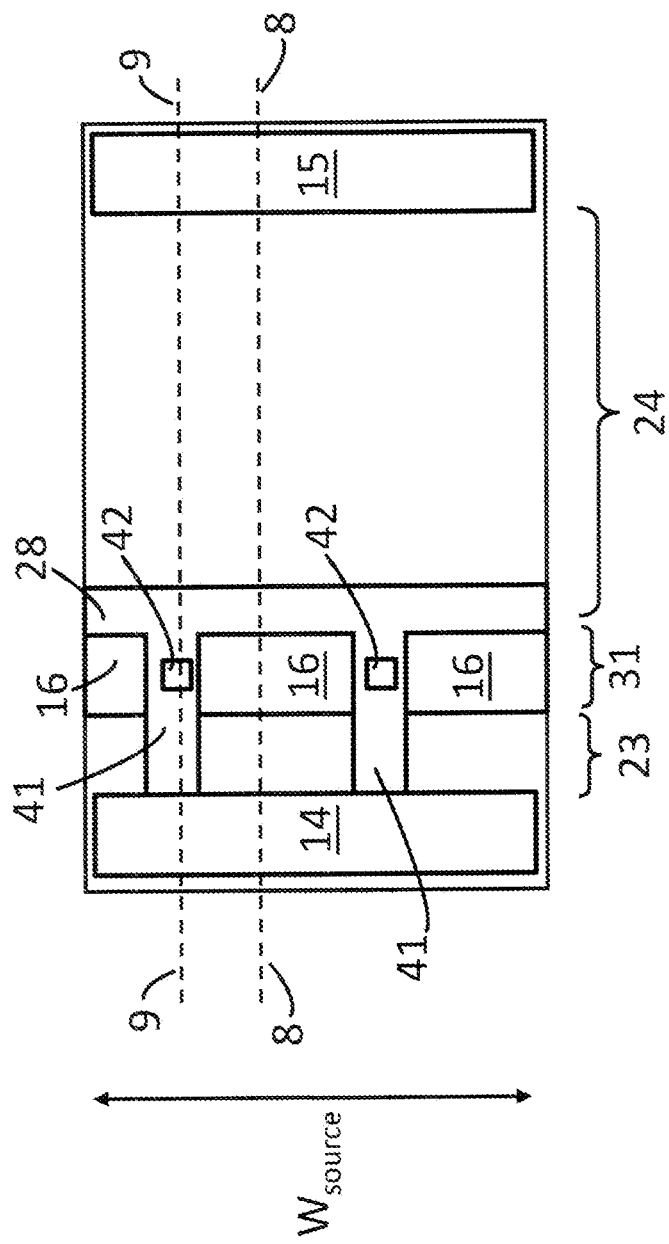
FIG. 8 is a plan view of yet another device according to this specification.
Figure 9:
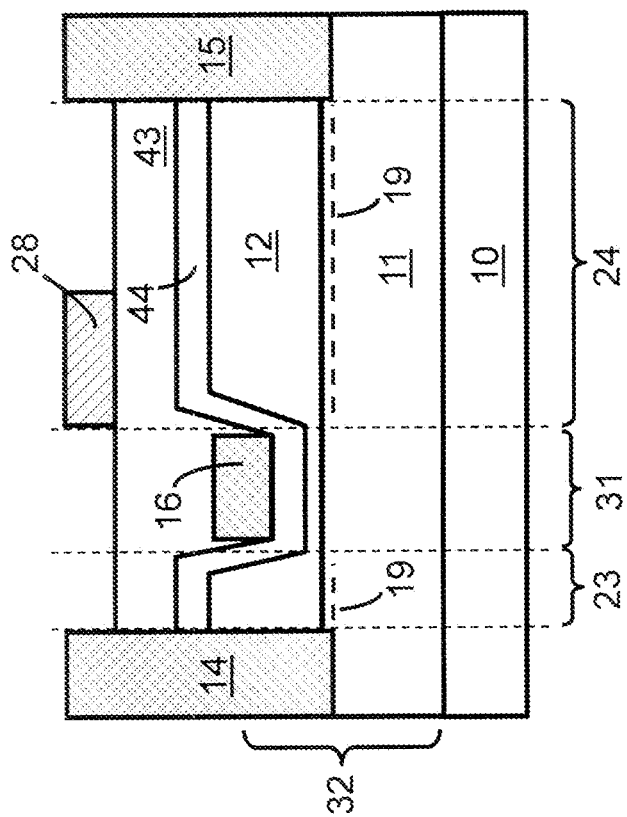
FIG. 9 is a cross-section through the cut 8-8 of the device of FIG. 8.
Figure 10:
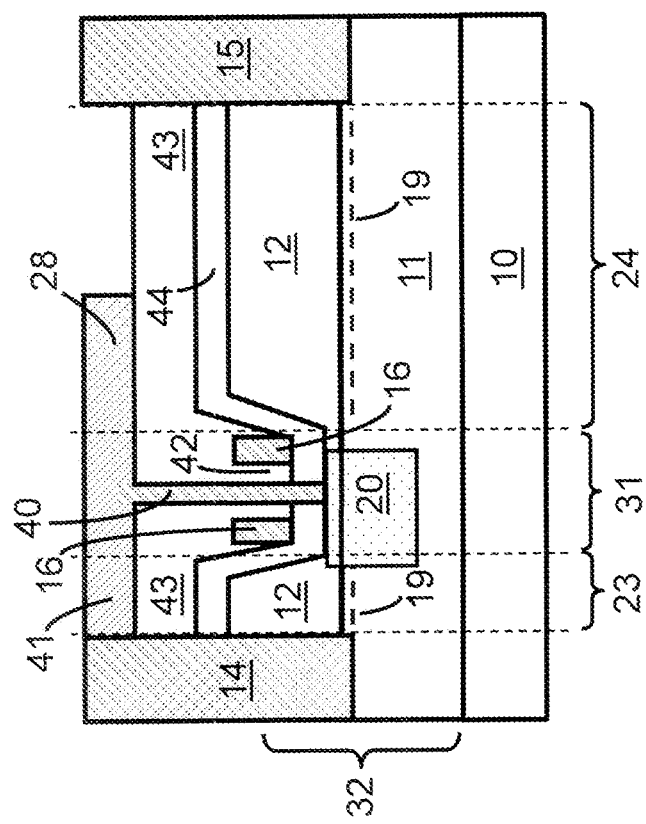
FIG. 10 is a cross-section through the cut 9-9 of the device of FIG. 8.

Another transistor device for which holes generated during operation can be collected by the gate 16 is illustrated in FIGS. 8-10. FIG. 8 is a plan view (top view) of the device, FIG. 9 is a cross-sectional view of the device along dashed line 8 in FIG. 8, and FIG. 10 is a cross-sectional view of the device along dashed line 9 in FIG. 8. In the device of FIGS. 8-10, holes are transported out of the semiconductor material 32 and collected through electrically conductive portions 40, which extend downwards from field plate 28 in regions 42 (best seen in FIGS. 8 and 10). As shown, electrically conductive portion 40 is electrically connected to the source 14 and to the field plate 28, resulting in holes being collected by the source 14 and/or field plate 28, and not by the gate 16.

Similarly to the transistors of previous implementations, the transistor of FIGS. 8-10 includes a III-N material structure 32 which includes a III-N channel layer 11 and a III-N barrier layer 12. The transistor also optionally includes a substrate 10 upon which the III-N material structure 32 is grown or deposited. The transistor may also be an enhancement-mode device. As seen in FIG. 9, a recess formed in the III-N barrier layer 12 beneath the gate electrode causes the conductive 2DEG channel 19 to be depleted of electrons in the gate region 31 when zero volts is applied to the gate 16 relative to the source 14, such that the device is in the off state. A sufficiently large positive voltage must be applied to the gate 16 relative to the source 14 to induce charge in the portion of the channel in the gate region, in order to turn the device on. Alternatively, the transistor can be made to be an E-mode device through alternative designs, for example by including a p-type III-N layer directly on the III-N barrier layer below the gate 16 in the gate region 31.

Referring to FIGS. 9 and 10, a gate insulator layer 44 is included in the gate region 31 between the gate electrode 16 and the III-N semiconductor material structure 32. The gate insulator layer 44 may optionally also extend to and at least partially cover the semiconductor material in the access regions 23 and 24, as shown. After depositing the gate 16 on the gate insulator layer 44, an additional insulator layer 43 is deposited over the gate 16 and over the gate insulator layer 44, as shown.

As seen in FIGS. 8 and 10, the field plate 28 is directly on the additional insulator layer 43 and is electrically connected to the source 14 by conductive extending portions 41. The additional insulator layer 43 separates the field plate 28 from the gate 16 and prevents the field plate 28 and the gate 16 from being electrically connected, thereby ensuring that the gate 16 and the field plate 28 are electrically isolated from one another. As used herein, two or more contacts or other elements such as conductive layers or components are said to be "electrically connected" if they are connected by a material which is sufficiently conducting so that the electric potential at each of the contacts or other elements will be similar, e.g., about the same or substantially the same, during operation. As used herein, elements which are not electrically connected are said to be "electrically isolated". Electrically isolated elements, although not maintained at substantially the same potential at all times, can be capacitively or inductively coupled.

Figure 11:
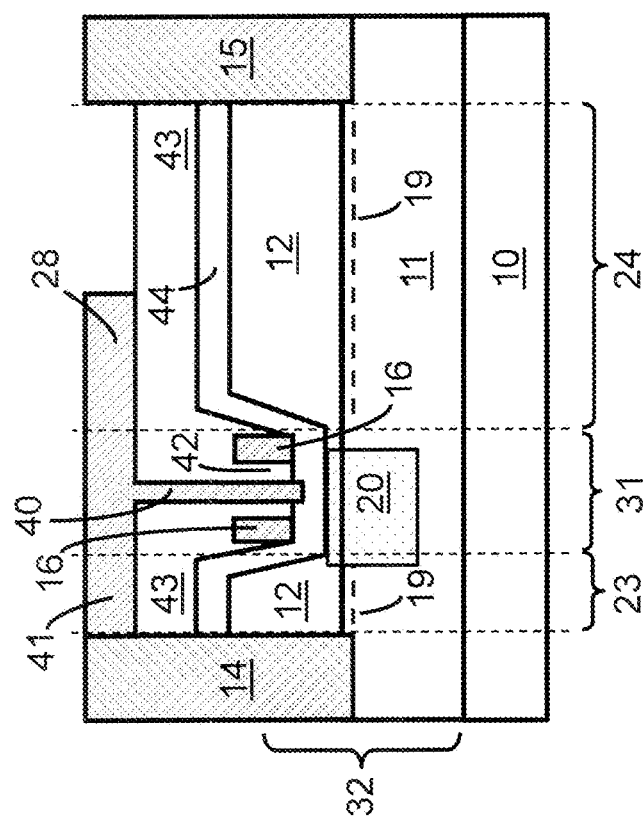
FIG. 11 is a cross-section through the cut 9-9 of an alternative implementation of the device of FIG. 8.

Still referring to FIGS. 8 and 10, gate 16 covers the entire gate region 31 of the III-N material structure 32 except in regions 42, in which the gate 16 is removed or is not included. Electrically conductive portions 40, which are electrically connected to the source 14 and to the field plate 28, extend downwards through the gate insulator layer 44 and contact the III-N material structure 32 in regions 42. Optionally, as illustrated in FIG. 10, a hole collector region 20 can also be included in the III-N material structure 32 in region 42. In applications in which the hole collector region also serves to limit the maximum channel current that can flow through the device, the hole collector region may need to at least be under the side of the gate 16 that is closest to the source 14. That is, the hole collector region can include a first portion which is in the source access region 23 and a second portion which is in the gate region 31, as illustrated in FIGS. 10 and 11. While not shown in FIGS. 10 and 11, the hole collector region 20 can also extend into the drain access region 24; that is, it can include a third portion which is in the drain access region 24. In devices with shorter gate lengths, having the hole collector region 20 extend into the drain access region 24 can result in the device being more easily manufacturable.

As illustrated in FIG. 11, in an alternative configuration to that shown in FIG. 10, the electrically conductive portion 40 may only extend partially through the gate insulator layer 44, such that the separation between the electrically conductive portion 40 and the III-N material structure 32 is less than or equal to the separation between the gate 16 and the III-N material structure 32. In this case, the resistance between the electrically conductive portion 40 and the hole collector region 20 can be less than the resistance between the gate 16 and the hole collector region 20, resulting in holes being collected by the source 14 rather than by the gate 16. In particular, the resistance to hole current flow between the electrically conductive portion 40 and the hole collector region 20 can be less than the resistance to hole current flow between the gate 16 and the hole collector region 20. An alternative way to ensure that holes are collected by the source 14 rather than by the gate 16 is to design the structure of FIGS. 10 and 11 such that the resistance (e.g., the total resistance and/or the resistance to hole current flow) between the hole collector region 20 and either the source 14 or field plate 28 is less than the resistance between the hole collector region 20 and the gate 16.

In some applications in which the transistor devices of FIGS. 2-11 are used, the transistor is operated in several different modes. For example, when the transistor is used as one of the switches in a half-bridge circuit configuration, at some times, the transistor is operated in a first mode in which the gate of the transistor is biased relative to the source at a voltage lower than the device threshold voltage (for example 0V if the transistor is an enhancement-mode transistor), the drain is biased at a high positive voltage relative to the source, and the transistor blocks the positive voltage applied to the drain relative to the source. At other times, the transistor is operated in a second mode in which the device conducts current from the source to the drain when the gate of the transistor is biased relative to the source at a voltage lower than the device threshold voltage (for example 0V if the transistor is an enhancement-mode transistor), and the drain is at a negative voltage relative to the source. This second mode of operation is often referred to as the "reverse-conduction mode" or "diode mode". At still other times, the transistor is operated in a third mode in which the device conducts current from the drain to the source when the gate of the transistor is biased relative to the source at a voltage higher than the device threshold voltage, and the drain is at a positive voltage relative to the source. This third mode is typically referred to as "standard conduction mode".

As used herein, the term "blocking a voltage" refers to the ability of a transistor, diode, device, or component to prevent significant current, e.g., current that is greater than 0.001 times the average operating current during regular on-state conduction, from flowing through the transistor, diode, device, or component when a voltage is applied across the transistor, diode, device, or component. In other words, while a transistor, diode, device, or component is blocking a voltage that is applied across it, the total current passing through the transistor, diode, device, or component will not be greater than 0.001 times the average operating current during regular on-state conduction.

When the transistor is operated in standard conduction mode, all substantial current flows from the drain to the source (i.e., electrons flow from the source to the drain) directly through the entire length of the 2DEG channel. In the case of diode mode operation (i.e., the second mode of operation), it may be preferable that all substantial current also flow from the source to the drain (i.e., electrons flow from the drain to the source) through the entire length of the 2DEG channel, as this can reduce switching losses. In the case of the transistor of FIGS. 8-10, a diode may be formed between the hole collector region 20 and semiconductor material between the hole collector region 20 and the drain 15. During the first and third modes of operation described above, the diode is reverse biased. However, during the second mode of operation, when the drain 15 is at a lower voltage than the source, the diode becomes forward biased. If the turn-on voltage of the diode is too low (i.e., lower than the source-drain voltage required to conduct the total current through the entire length of the channel), then the diode turns on, resulting in at least some substantial source-drain current flowing from the source to the drain through electrically conductive portion 40. This would result in the diode switching from off to on during operation, which can result in undesirable effects such as increased switching losses during operation. As such, it is typically preferable to design the hole collector region 20 such that the diode has a turn-on voltage which is sufficiently large to prevent substantial current from flowing through the contact between the electrically conductive portion 40 and the hole collector region 20 during the second mode of operation. Increasing the turn-on voltage can be achieved in a number of ways, for example by choosing a metal for electrically conductive portion 40 with a large work function, or by performing a treatment to the surface of the III-N material on which the electrically conductive portion 40 is deposited on and contacts.

In all implementations described herein, hole collector regions can have the following properties. They can be regions in which the semiconductor material is etched, in some cases at least through the device channel. In this case, a metal electrode or a portion of the source or gate metal may electrically contact at least a portion of the semiconductor surface which was exposed by the etch. Alternatively, they can be doped regions (for example doped by ion implantation) in the semiconductor material, where the implanted regions can extend through the channel region, thereby forming a break in the device channel. Doped regions such as ion implanted regions may be capable of conducting substantial hole, but not substantial electron currents. For example they can be p-type or nominally p-type regions.

A number of implementations have been described. Nevertheless, it will be understood that various modifications may be made without departing from the spirit and scope of the techniques and devices described herein. For example, in devices in which the electrode (or portion of the electrode) which collects holes is separated from the underlying III-N materials by an insulating layer (for example, the devices shown in FIGS. 2-4 and 11), it may be preferable to select an insulator layer for which the valence band edge in the insulator layer is higher than that in the III-N barrier layer at the interface between the insulator layer and the barrier layer. Such a configuration can result in more efficient collection of holes. Alternatively, efficient collection of holes may still be possible in structures where the valence band edge in the insulator layer is lower than that in the III-N barrier layer at the interface between the insulator layer and the barrier layer, provided the valence band discontinuity at this interface is less than 2 electron-volts. Accordingly, other implementations are within the scope of the following claims.

What is claimed is:

1. A transistor device, comprising:
 a source, a gate, and a drain;
 a semiconductor material which includes a gate region between the source and the drain;
 a plurality of channel access regions in the semiconductor material between the source and the gate, and between the drain and the gate, respectively;
 a channel in the semiconductor material;
 an insulating material over the semiconductor material, the insulating material having a first portion over the gate region and a second portion over at least one of the plurality of channel access regions, a thickness of the first portion being less than a thickness of the second portion; and
 one or more hole collector regions at least partially in the gate region of the semiconductor material, the one or more hole collector regions extending through the channel and forming a break in the channel; wherein
 the one or more hole collector regions are configured to conduct substantial hole current but not substantial electron current during operation of the transistor device; and
 the insulating material is between the gate and the semiconductor material and prevents the gate from contacting the semiconductor material in the gate region.

2. The transistor device of claim 1, wherein the first portion of the insulating material is sufficiently thin to allow holes generated during device operation to be collected by the gate.

3. The transistor device of claim 1, wherein the first portion of the insulating material is sufficiently thin to allow holes generated during device operation to be transported out of the semiconductor material through the gate.

4. The transistor device of claim 1, wherein the device includes at least two hole collector regions in the gate region of the semiconductor material.

5. The transistor device of claim 1, wherein the hole collector region contains dopants.

6. The transistor device of claim 5, wherein the dopants are selected from the group consisting of Mg, Al, and Fe.

7. The transistor device of claim 1, wherein the device is a III-N transistor.

8. The transistor device of claim 1, wherein the device is a high-voltage device.

9. The transistor device of claim 1, wherein the device is a field-effect transistor.

10. The transistor device of claim 1, wherein the insulating material comprises a first insulating material layer and a second insulating material layer.

11. The transistor device of claim 10, wherein the second portion of the insulating material includes both the first and second insulating material layers, and the first portion of the insulating material includes the first insulating material layer but not the second insulating material layer.

12. The transistor device of claim 1, wherein the insulating material is over an entirety of the one or more hole collector regions.

13. The transistor device of claim 1, wherein the maximum hole current density that the one or more hole collector regions are configured to conduct is at least 100 times the maximum electron current density that the one or more hole collector regions are configured to conduct.

14. A transistor device, comprising:
 an electrode;
 a semiconductor material which includes a gate region between two channel access regions;
 a channel in the semiconductor material;
 an insulating material over the semiconductor material; and
 a hole collector region in the semiconductor material below the electrode, the hole collector region extending through the channel and forming a break in the channel; wherein
 the hole collector region is configured to conduct substantial hole current but not substantial electron current during operation of the transistor device;
 the insulating material is between the electrode and the hole collector region and prevents the electrode from contacting the hole collector region; and
 at least a portion of the insulating material that is between the electrode and the hole collector region is sufficiently thin to allow holes generated during device operation to be collected by the electrode.

15. The transistor device of claim 14, wherein the portion of the insulating material that is between the electrode and the hole collector region is sufficiently thin to allow holes generated during device operation to be transported out of the semiconductor material through the electrode.

16. The transistor device of claim 14, wherein the electrode is a gate, and the transistor further comprises a source and a drain.

17. The transistor device of claim 16, wherein the portion of the insulating material that is between the electrode and the hole collector region is a first portion, the insulating material comprising a second portion between the gate and the drain, wherein the first portion is thinner than the second portion.

18. The transistor device of claim 14, wherein the insulating material prevents the electrode from contacting the semiconductor material.

19. The transistor device of claim 14, wherein the semiconductor material includes a III-N material.

20. The transistor device of claim 14, wherein the hole collector region contains dopants.

21. The transistor device of claim 20, wherein the dopants are selected from the group consisting of Mg, Al, and Fe.

22. A method of forming a transistor device, comprising:
 providing a III-N semiconductor material having a channel therein;
 forming a source, a gate, and a drain on the III-N semiconductor material, wherein the III-N semiconductor material includes a gate region between the source and the drain and a plurality of channel access regions between the source and the gate, and between the drain and the gate, respectively;

doping a portion of the III-N semiconductor material, wherein the doped portion comprises one or more hole collector regions, the one or more hole collector regions being at least partially in the gate region, the one or more hole collector regions extending through the channel to form a break in the channel, the one or more hole collector regions being configured to conduct substantial hole current but not substantial electron current during operation of the transistor device; and forming an insulating material over the III-N semiconductor material, the insulating material having a first portion over the gate region and a second portion over at least one of the plurality of channel access regions, a thickness of the first portion being less than a thickness of the second portion; wherein the insulating material is between the gate and the III-N semiconductor material and prevents the gate from contacting the semiconductor material in the gate region.

23. The method of claim 22, wherein the doping comprises ion implantation of dopants.

24. The method of claim 23, wherein the dopants are selected from the group consisting of Mg, Al, and Fe.

* * * * *